(12) United States Patent
Monga et al.

(10) Patent No.: US 10,340,940 B2
(45) Date of Patent: Jul. 2, 2019

(54) VARIABLE STEP SWITCHED CAPACITOR BASED DIGITAL TO ANALOG CONVERTER INCORPORATING HIGHER ORDER INTERPOLATION

(71) Applicant: University College Dublin, Dublin (IE)

(72) Inventors: Sushrant Monga, New Delhi (IN); Robert Bogdan Staszewski, Dublin (IE)

(73) Assignee: UNIVERSITY COLLEGE DUBLIN, Dublin (IE)

( * ) Notice: Subject to any disclaimer, the term of this patent is extended or adjusted under 35 U.S.C. 154(b) by 0 days.

(21) Appl. No.: 15/977,987

(22) Filed: May 11, 2018

(65) Prior Publication Data

US 2018/0331691 A1 Nov. 15, 2018

Related U.S. Application Data

(60) Provisional application No. 62/505,252, filed on May 12, 2017.

(51) Int. Cl.
*H03M 1/50* (2006.01)
*H03M 1/66* (2006.01)
(Continued)

(52) U.S. Cl.
CPC .............. *H03M 1/661* (2013.01); *H03M 1/00* (2013.01); *H03M 1/802* (2013.01); *H03M 1/804* (2013.01); *H03M 3/30* (2013.01)

(58) Field of Classification Search
CPC .......... H03M 1/66; H03M 3/30; H03M 1/802; H03M 1/804; H03M 1/00
(Continued)

(56) References Cited

U.S. PATENT DOCUMENTS

2011/0109585 A1* 5/2011 Kwon ................... G06F 3/0418
345/174

OTHER PUBLICATIONS

Suarez, R.E. et al., "All-MOS charge-redistribution analog-to-digital conversion techniques—Part II", IEEE J. Solid-State Circuits, vol. SC-10, No. 6, pp. 379-385, Dec. 1975.
(Continued)

*Primary Examiner* — Joseph J Lauture
(74) *Attorney, Agent, or Firm* — Zaretsky Group PC; Howard Zaretsky

(57) ABSTRACT

A novel and useful variable step serial DAC having a desired trajectory between input samples with a defined slope at intermediate points to form the output dynamic curve. The serial DAC is implemented to achieve higher order interpolation between the input sample points in the analog domain using switched capacitor CMOS circuits and without the use of a sample and hold circuit at the output. Conceptually, only two capacitors are needed for defining the output voltage for the conventional serial DAC. Dynamically programmable capacitor arrays define, via digital codes, the desired interpolation trajectory or output curve for the DAC between input sample points by defining the ratio of input charge Q(i) to the total capacitance C(i) at the $i^{th}$ time interval [Q(i)/C(i)]. The voltage at the output of the DAC is defined by incremental charge transfer at a defined rate between the input sample points. This technique uses minimum energy and area to define the dynamic curve for the DAC.

23 Claims, 15 Drawing Sheets

(51) Int. Cl.
  *H03M 3/00* (2006.01)
  *H03M 1/80* (2006.01)
  *H03M 1/00* (2006.01)

(58) Field of Classification Search
  USPC .................................. 341/144, 143, 172, 150
  See application file for complete search history.

(56) References Cited

OTHER PUBLICATIONS

Filho, P.E.P, et al., "An incremental-charge-based digital transmitter with built-in filtering", IEEE Journal of Solid-State Circuits, vol. 50, No. 12, pp. 1-12, Dec. 2015.
Roverato, E., et al., "A configurable sampling rate converter for all-digital 4G transmitters", Proc. ECCTD, pp. 1-4, Sep. 2013.

* cited by examiner

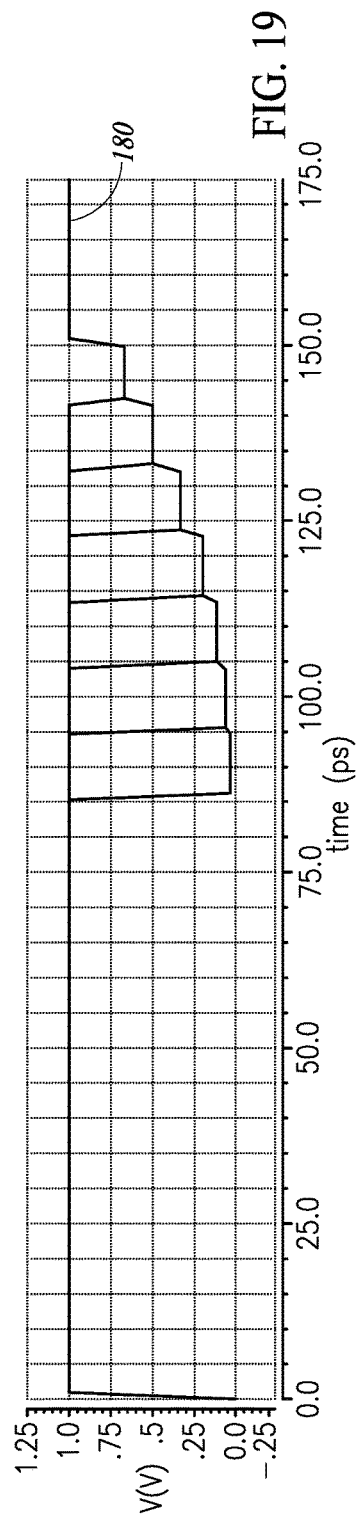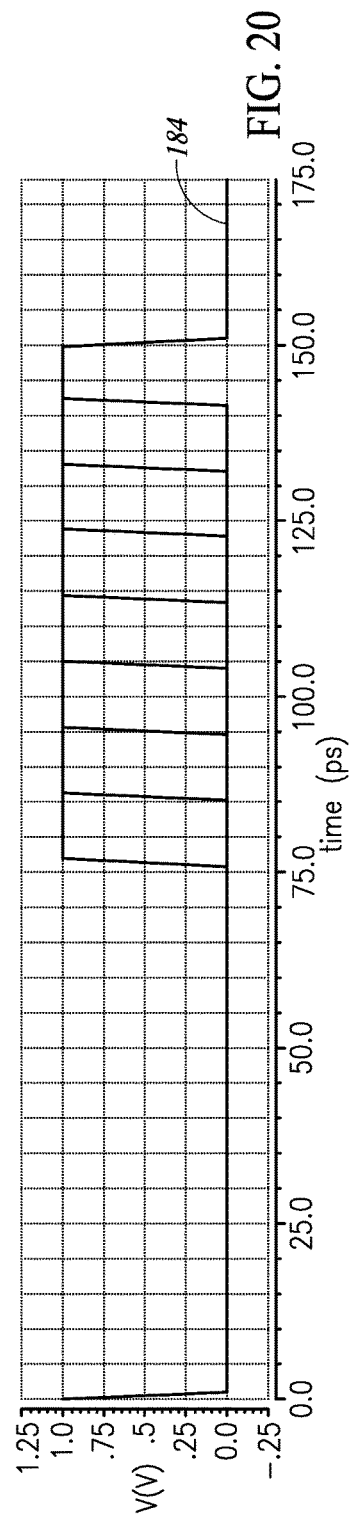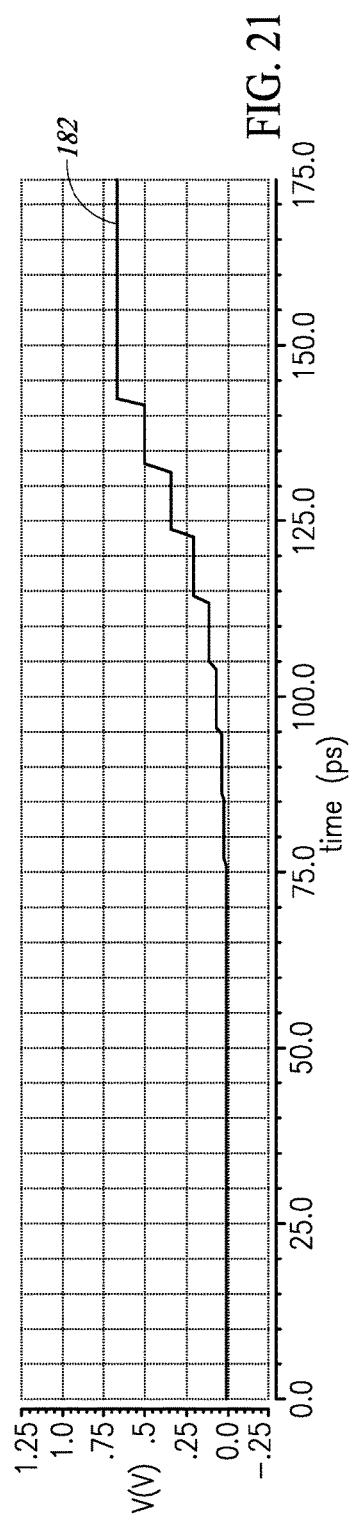

VARIABLE STEP SWITCHED CAPACITOR BASED DIGITAL TO ANALOG CONVERTER INCORPORATING HIGHER ORDER INTERPOLATION

REFERENCE TO PRIORITY APPLICATION

This application claims the benefit of U.S. Provisional Application No. 62/505,252, filed May 12, 2017, entitled "Variable Step Switched Capacitor DAC With Higher Order Interpolation," incorporated herein by reference in its entirety.

FIELD OF THE DISCLOSURE

The subject matter disclosed herein relates to the field of digital to analog converters and more particularly relates to a variable step serial DAC with a dynamic desired trajectory between input samples.

BACKGROUND OF THE INVENTION

Digital to analog converts are well known in the art. They function to convert a digital input code to an output analog entity, typically voltage or current. One challenge in the design of a DAC is the filtering of signal images at the harmonics of the sampling frequency ($f_S$). For the zero-order hold DAC, Sinc response of the zero-order hold function filters the desired signal. As the signal bandwidth increases given a sampling frequency, the desired roll-off is far from achievable using the Sinc response. Oversampling is one technique used to distance the images in the frequency domain. But as the signal bandwidth increases, oversampling by a higher factor increases the overall complexity of the system while still being unable to achieve the desired roll-off for wide-band signals.

A diagram illustrating an example output of a prior art zero-order hold DAC in time and frequency is shown in FIG. 1. Where x(t) 10 in the upper graph represents the desired signal in the time domain and $x_q(t)$ 12 represents the quantized signal. In the lower graph, dashed line 14 represents the desired signal while dashed lines 18 represent images in the frequency domain.

Linear interpolation between the input samples can be applied for a better roll-off achieving a $Sinc^2$ response for filtering the desired signal. It yields better performance than zero-order hold but it is still short of the desired filtering in contrast to the use of large oversampling ratios for a given scenario. Implementing oversampling at higher signal bandwidths remains a challenge although a current-based DAC approach can be used largely for modest bandwidth and oversampling frequencies. MOS currents are added based on the binary code that activates the respective MOS transistors. This technique has disadvantages and known solutions improve performance only marginally.

Digital solutions are known that use Cubic Lagrangian Interpolation between the samples followed by Cascaded integrator-comb (CIC) filters to provide filtering of the desired signal. The disadvantage of the pure digital implementation is use of adders and multipliers to implement the interpolation function that consume a lot of power and area depending upon the implementation. Moreover, to add programmability to the design requires enhanced digital structures that are typically very power hungry. The cubic interpolators and the CIC filters pose design challenges as the frequencies upscale and are limited in performance.

There is thus a need for a DAC that overcomes the problems of the prior art and that provides superior desired output performance.

SUMMARY OF THE INVENTION

The present invention is a variable step serial DAC having a desired trajectory between input samples with a defined slope at intermediate points to form the output dynamic curve. The serial DAC is implemented to achieve higher order interpolation between the input sample points in the analog domain using switched capacitor CMOS circuits and without the use of a sample and hold circuit at the output. Conceptually, only two capacitors are needed for defining the output voltage for the conventional serial DAC. Dynamically programmable capacitor arrays define, via digital codes, the desired interpolation trajectory or output curve for the DAC between input sample points by defining the ratio of input charge Q(i) to the total capacitance C(i) at the $i^{th}$ time interval [Q(i)/C(i)]. The voltage at the output of the DAC is defined by incremental charge transfer at a defined rate between the input sample points. This technique uses minimum energy and area to define the dynamic curve for the DAC.

This, additional, and/or other aspects and/or advantages of the embodiments of the present invention are set forth in the detailed description which follows; possibly inferable from the detailed description; and/or learnable by practice of the embodiments of the present invention.

There is thus provided in accordance with the invention, a digital to analog converter (DAC) for generating a desired output voltage, comprising an input circuit for receiving first digital input codes representing sample points of the desired output voltage, an interpolator circuit coupled to the input circuit and including one or more dynamically programmable capacitor arrays, the interpolator circuit operative to interpolate the samples points in an analog domain in accordance with a desired interpolation profile, an output circuit coupled to the interpolator circuit, and wherein the interpolator circuit is operative to generate the output voltage between the input sample points by incremental charge transfer at a rate corresponding to the interpolation profile.

There is also provided in accordance with the invention, a digital to analog converter (DAC) for generating an output voltage, comprising an output capacitor adapted to provide the output voltage, a plurality of dynamically programmable switched capacitor arrays coupled to the output capacitor, each capacitor array switchably coupled to the output capacitor and corresponding to a different interpolation profile, each capacitor array operative to generate incremental charges that are periodically transferred to the output capacitor, a processor operative to receive first digital input codes representing input samples of a desired output voltage, determine a desired voltage trajectory between consecutive input samples based on a plurality of historical input samples, select an interpolation profile in accordance with the desired voltage trajectory, and control a selected one of the capacitors arrays whereby incremental charge is transferred to the output capacitor in accordance with the selected interpolation profile.

There is further provided in accordance with the invention, a method of converting a set of digital input codes to a desired output voltage, the method comprising receiving a stream of digital input codes representing input sample points of the desired output voltage signal, determining a voltage excursion between consecutive input sample points, dividing time between consecutive input sample points into a plurality of interpolation steps, and at each the interpolation step, transferring charge to an output capacitor to generate the output voltage, wherein the charge is proportional to an incremental portion of the voltage excursion.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein:

FIG. 19 is a diagram illustrating the voltage across the capacitors over time;

FIG. 20 is a diagram illustrating the clocking for the capacitors;

FIG. 21 is a diagram illustrating the voltage across the output capacitor over time;

DETAILED DESCRIPTION

Figure 1:
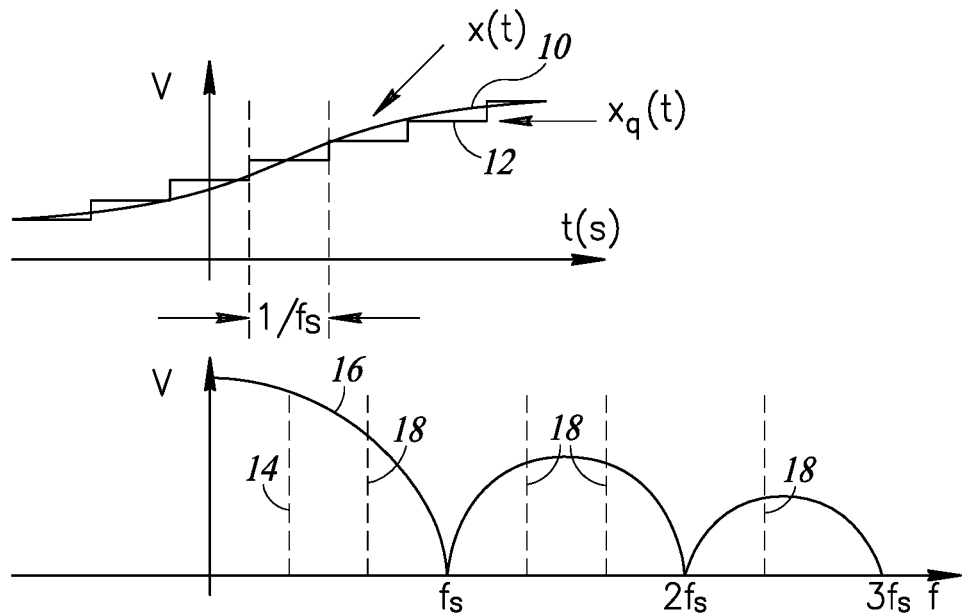
FIG. 1 is a diagram illustrating an example output of a prior art zero-order hold DAC in time and frequency.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 2:
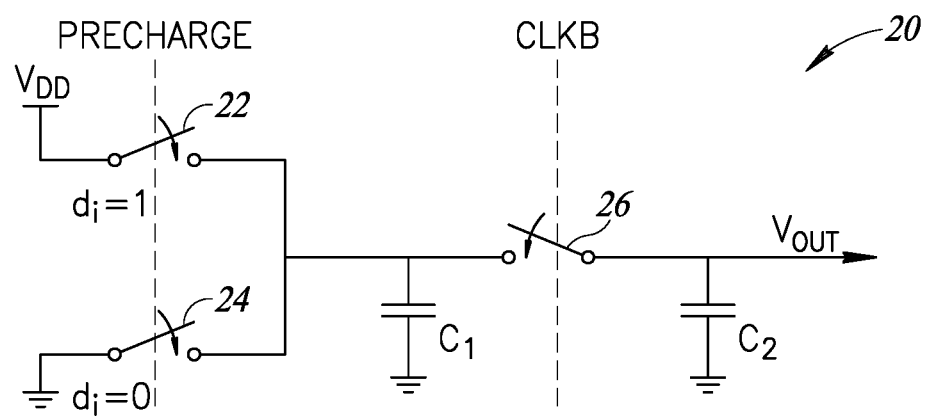
FIG. 2 is a diagram illustrating an example serial DAC for implementing desired higher order interpolation.
Figure 3:
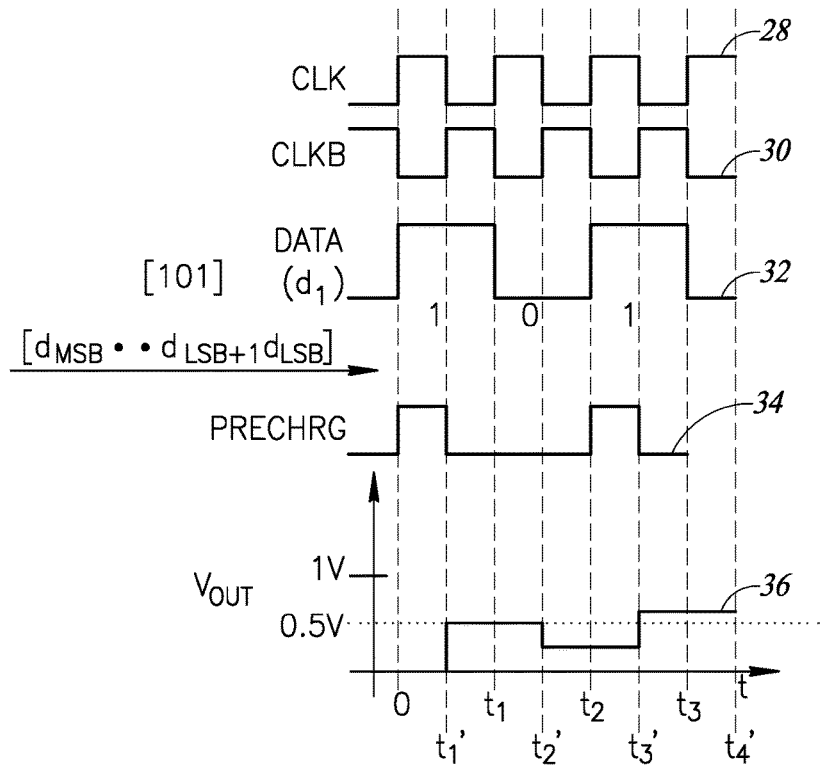
FIG. 3 is a timing diagram illustrating signal timing for the serial DAC of FIG. 2.

A diagram illustrating an example serial DAC for implementing desired higher order interpolation is shown in FIG. 2. A timing diagram illustrating signal timing for the serial DAC of FIG. 2 is shown in FIG. 3.

The circuit, generally referenced 20, comprises pre-charge switches 22, 24, switch 26 and capacitors $C_1$ and $C_2$. The circuit operates as the well-known serial DAC and is used to implement desired higher order interpolation. In the serial DAC, data is fed serially to pre-charge $C_1$ synchronously with the clock signal, i.e. CLK signal 28, and CLKB signal 30. The figure shows the plot of $V_{OUT}$ 36 for $C_1=C_2$ for the data bit stream [101] 32. The output is non-monotonic and undefined between the sample points as the data is sampled at fixed instants to obtain the final output. For an m-bit serial data word, the charge is serially transferred in m clock cycles of CLK/CLKB. For an m-bit input data word to the DAC it takes [$m/f_{CLK}$] seconds to produce valid data at the output.

Figure 4:
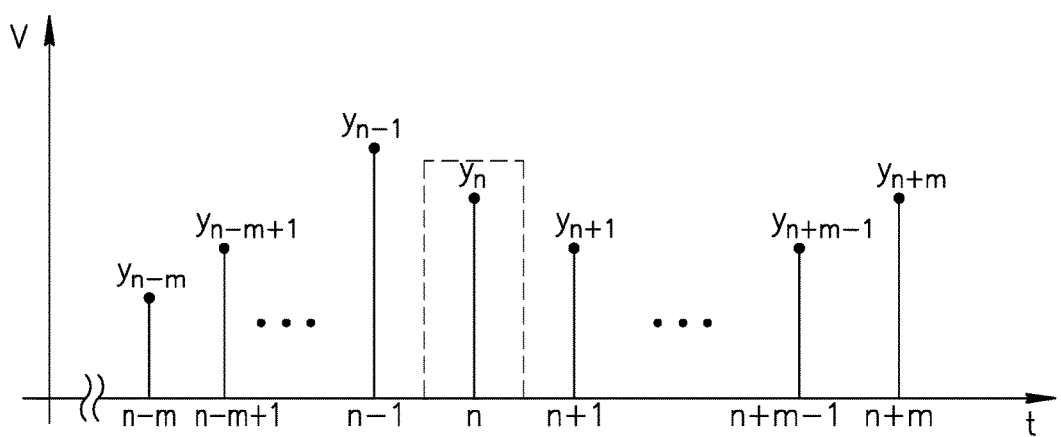
FIG. 4 is a diagram illustrating example input samples to the DAC on the time axis.

A diagram illustrating example input samples to the DAC on the time axis is shown in FIG. 4. This figure shows the set of input samples to the DAC in the time domain. The set of values ( . . . $y_{n-2}$, $y_{n-1}$, $y_n$, $y_{n+1}$, $y_{n+2}$, . . . ) are the input samples to the DAC at respective time instants ( . . . n−2, n−1, n, n+1, n+2, . . . ) identified by the indices.

In one embodiment, the use of sample and hold (as in the case of generic DAC) is omitted at the fixed time instants and the output waveform that builds up corresponds to the incoming serial data bits. This yields an analog DAC circuit solution having a higher resolution emulating the oversampling with respect to the step jump corresponding to each bit in the serial data bit stream.

In one embodiment, an incremental charge transfer DAC is provided that transfers the charge at every step with the oversampling frequency, i.e. specified as the LO frequency for the RFDAC. The charge is transferred at high frequency which demands higher system efficiency in terms of the transfer bandwidths for the components involved. In addition, it emulates oversampling of the DAC with incremental charge transfer.

In one embodiment, higher order implementation is achieved using a switched capacitor circuit with a minimum of system requirements to achieve optimized power and area compared to prior art circuits.

To ensure monotonic transitions between the input sample points, only incremental charge transfer is utilized. In one embodiment, a digital calculator is used to calculate the voltage difference between the consecutive samples and transfer a charge to the output of the DAC that is proportional to the incremental voltage difference. In a first-hand approximation of the invention, the progressive difference between input samples is synthesized into a digital code to transfer the incremental charge in the serial DAC. A desired trajectory between the sample points is defined for the desired interpolation using a set of future samples together with the current sample. Based on the above data, the value of $C_1$ is dynamically programmed at each step in accordance with the charge balance equations to achieve the desired interpolation curve.

Considering the case of the general serial DAC as shown in FIG. 2. Let the voltages on capacitors $C_1$ and $C_2$ be $V_{C1}$ and $V_{C2}$ respectively when CLKB=0. In this state, when the CLKB signal goes high to ideally short the switch between $C_1$ and $C_2$, the resultant voltage at the output is then given by $$V_{OUT} = V_{C1+C2} = \frac{V_{C1} * C_1 + V_{C2} * C_2}{C_2 + C_1} \tag{1}$$

Given a constant $C_2$, $V_{OUT}$ is a function of the values of $C_1$ and the initial voltages on both capacitors. For the serial DAC, $C_1$ is charged to the supply rail or ground depending upon the corresponding data bit at a given time instant. The charge is subsequently shared to the output every clock cycle (see FIGS. 2 and 3). This is repeated for each following bit. The circuit is operative to determine the incremental change in voltage between two consecutive values, where the increment can only be in either a positive or negative direction. This implies that $C_2$ can be charged either upwards towards a higher potential or discharged downwards to a lower potential to generate the dynamic curve.

Note that some possible interpolation between the input sample points can generate uncontrolled trajectory, large high frequency noise, and iterative charging and discharging of $C_1$ that consumes a lot of power.

Figure 5:
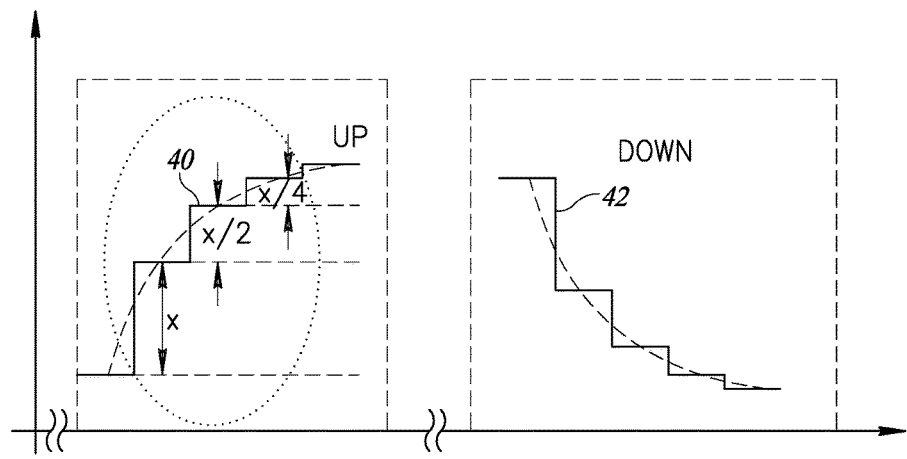
FIG. 5 is a dynamic output curve for the incremental change (up/down) as (1111/0000) on the time axis.

A dynamic output curve for the incremental change (up 40/down 42) as (1111/0000) on the time axis is shown in FIG. 5. To step the voltage incrementally between the two sample points, capacitor $C_1$ is varied progressively in p interpolation steps between the sample points to define a desired output dynamic curve. This emulates oversampling in the DAC by p-times with the definition of the gradient at each step of the dynamic curve.

Figure 6:
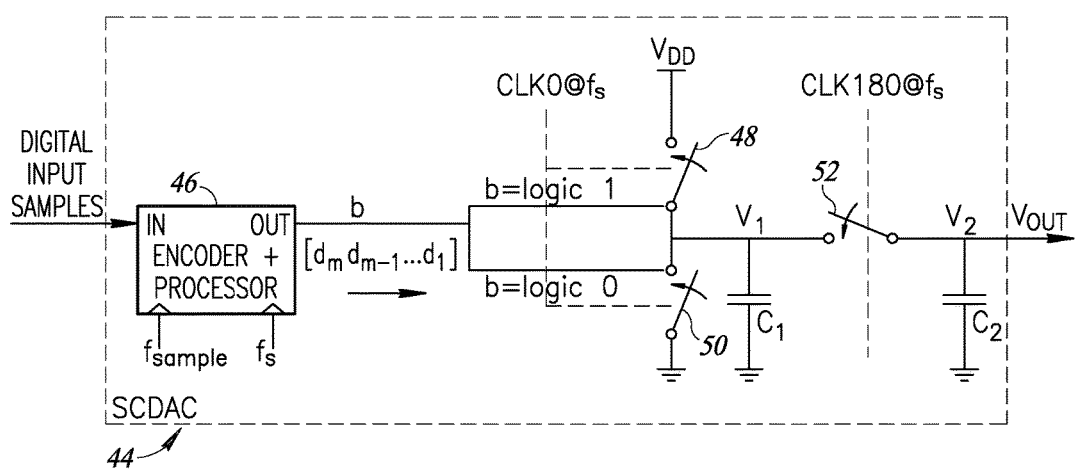
FIG. 6 is a diagram illustrating a first example embodiment of the switched capacitor DAC of the present invention.

A diagram illustrating a first example embodiment of the switched capacitor DAC of the present invention is shown in FIG. 6. The switched capacitor DAC, generally referenced 44, comprises a processor block 46, pre-charge capacitors 48, 50 connected to $V_{DD}$ and ground, switch 52, and capacitors $C_1$ and $C_2$. The variation in the capacitor value $C_2$ directly translates to the desired interpolation between the sample points. Note that essentially capacitor $C_1$ is varied with respect to a given load of $C_2$, the proportion of $C_1$ that is incremented every trigger edge of the sampling clock for a given $C_2$. Since the increment can have two possible directions, i.e. towards the supply voltage or ground, the charge can be added or subtracted on a resultant capacitance $C=C_1+C_2$ to define the output voltage. Since constant supply voltages charge/discharge the respective capacitors (these are the capacitors which form C1 and whose values are calculated mathematically to transfer a given amount of charge in a given cycle of charge transfer to define the output dynamic curve), the charge transferred in any given time slot ($t_q$) is proportional to the total capacitance C (should be put as progressive definition of the value of C1 with respect to the given value of C2 as guided by equation (1)) as shown in FIG. 5. In one embodiment, to define the gradient, the interpolation step size can be programmed as a function of future samples. This is done by calculating the first difference, second difference, and so on depending upon the number of samples to be used in the calculation of the step size.

Note that at every interpolation cycle, only the charge corresponding to the voltage difference between the consecutive input samples is transferred. The output voltage is thus monotonic as desired for the output DAC between successive samples. The processor transforms the incoming n-bit data word (parallel input) into a serial output m-bit data word.

Figure 7:
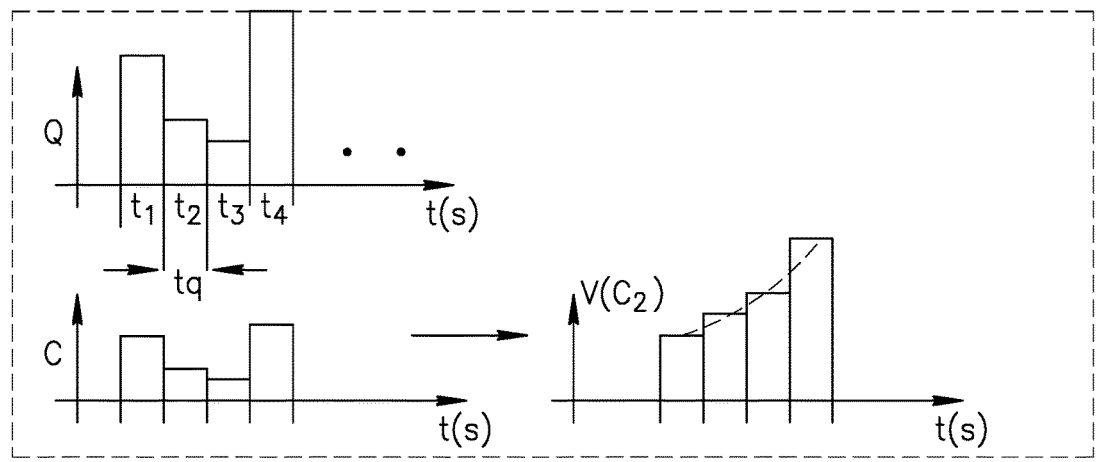
FIG. 7 is a diagram illustrating an example upwardly concave interpolation.
Figure 8:
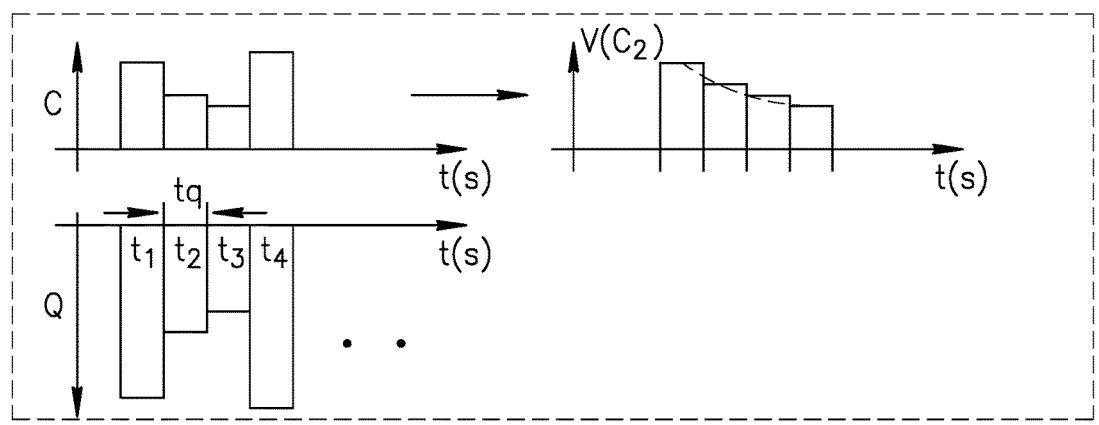
FIG. 8 is a diagram illustrating an example downwardly concave interpolation.

Depending upon the state of the DAC, i.e. the output voltages on the respective capacitors and the required increment/decrement, the total excursion between two consecutive sample points is divided into a certain number of interpolation steps (e.g., p-steps) and $C_1$ is progressively varied at each step with pre-charged capacitor segments switched in to perform the desired interpolation. Depending upon the desired trajectory, e.g., concave, convex, linear, nonlinear, binary, exponential, arithmetic, geometric, and unary, or any other defined shape. For example, a diagram illustrating an example upwardly concave interpolation is shown in FIG. 7 and a diagram illustrating an example downwardly concave interpolation is shown in FIG. 8.

Figure 9:
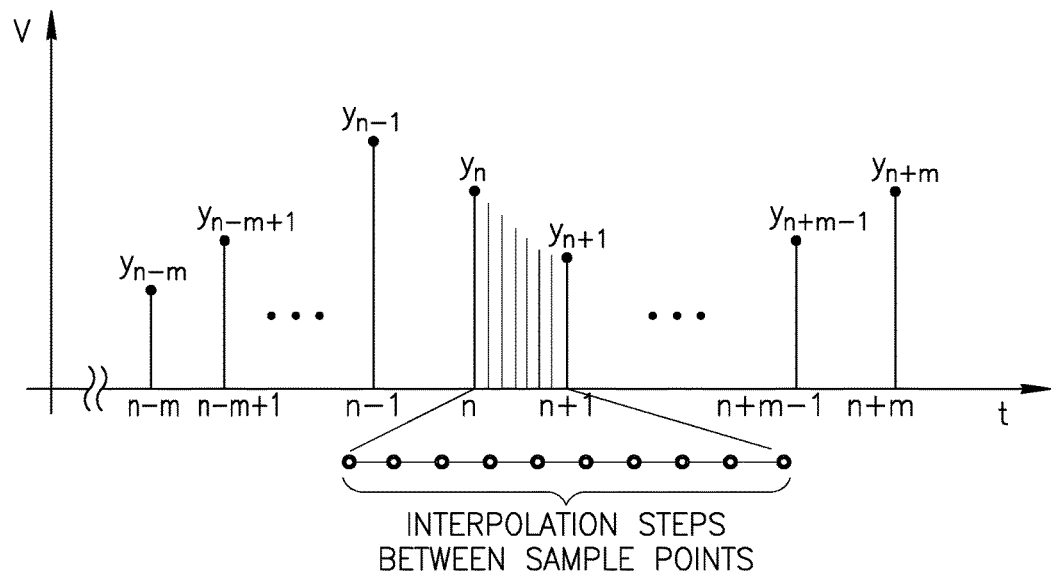
FIG. 9 is a diagram illustrating an example of fitting the desired interpolation (concave for example)

A diagram illustrating an example of fitting the desired interpolation (concave for example) is shown in FIG. 9. The time between input sample points to the DAC is divided into a plurality of p interpolation steps. Mathematically, starting with a given state of the DAC at time instant 'n' the capacitance $C_1$ at t=n is augmented by p-capacitors as follows $$C_{(1,n,1)} = G1(y_{n1}, y_{n2}, \ldots, y_{n15}, f(y_n, y_{n+1}, y_{n+2}, \ldots y_{n+m-1}, y_{n+m})) \quad (2)$$

$$C_{(1,n,2)} = G2(y_{n2}, \ldots, y_{n15}, f(y_n, y_{n+1}, y_{n+2}, \ldots y_{n+m-1}, y_{n+m}))$$

$$\ldots$$

$$C_{(1,n,15)} = G2(y_{n+1}, f(y_n, y_{n+1}, y_{n+2}, \ldots y_{n+m-1}, y_{n+m}))$$

Thus, for any time interval between two input samples, the p-interpolation steps are defined by the capacitor series $[C_{(1,n,1)}, C_{(1,n,2)}, C_{(1,n,3)}, \ldots C_{(1,n,15)}]$, wherein the first (left) index indicates 'capacitor C1 capacitors', the middle index indicating the particular capacitor array, and the last (right) index indicating the capacitor within the particular capacitor array. Note that in one embodiment, the function 'f' defines the calculated value of the capacitor that corresponds to a particular interpolation for the dynamic output curve. The functions are mathematically calculated by the law of conservation of charge by adding a chosen value of the quanta of charge very clock edge.

For the case of a binary weighted array, assume at t=0, $V(C_2)=x$ (normalized to $V_{DD}$) and the capacitors can be also normalized to the values of $C_2=C$. The successive charging at each clock cycle can be defined for the binary weighted capacitor array as follows:

$$V_{OUT}(1) = \frac{1 + xk}{1 + k} \quad (3)$$

$$V_{OUT}(2) = \frac{3 + xk}{3 + k} \quad (4)$$

$$V_{OUT}(3) = \frac{7 + xk}{7 + k} \quad (5)$$

$$\vdots$$

$$V_{OUT}(8) = \frac{2^8 - 1 + xk}{2^8 - 1 + k} \quad (6)$$

Note that in one embodiment the capacitance can be varied progressively (at each clock cycle) by solving the charge balance equations given the slope of dynamic curve between the digital sample points. It is found that the total charge-to-total capacitance ($Q_{total}/C_{total}$) ratio does not remain monotonic for a monotonically increasing/decreasing value for the total capacitances. In the example embodiment, a maximum of eight steps can be performed before we lose monotonicity for given sample points. The value of the ratio 'k' can be found from the equation below where the increment after eight steps can be set to the desired quantization level.

$$\Delta vout(8) \mid x = \frac{2^8 - 1(1 - x)}{2^8 - 1 + k} = \Delta q_{int} \quad (7)$$

Where $\Delta q_{int}$ represents the fraction of quantization interval and $\Delta v_{out}$ represents the voltage increment after eight steps.

This provides an efficient solution in terms of area and power consumed to implement the desired interpolation. In one embodiment, the system can be implemented with MOS switches and capacitors in any given technology with the respective elements operating at a much lower frequency (i.e. the input sample frequency to the DAC) in contrast to the interpolation rate.

Figure 10:
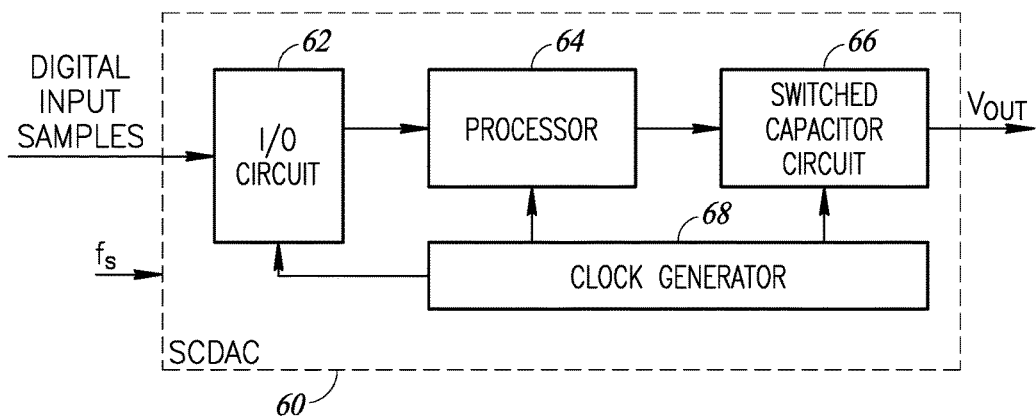
FIG. 10 is a high-level block diagram illustrating a second example switched capacitor DAC of the present invention.

A high-level block diagram illustrating a second example switched capacitor DAC of the present invention is shown in FIG. 10. The switch capacitor DAC (SCDAC), generally referenced 60, comprises input/out (I/O) circuit 62, processor block 64, switched capacitor circuit 66, and clock generator circuit 68. Digital input samples are received by the I/O circuit and processed by the processor. The time between sample points is divided into p interpolation steps. The processor directs the transfer of charge in the switched capacitor circuit every clock cycle to yield the output $V_{OUT}$.

Note that with the SCDAC of the present invention, switching at a high clock frequency is replaced with adding capacitances at each phase of the sampling frequency. No reset is required as is the case with prior art DACs, thereby saving power, minimizing area, and resulting in the fastest transfer (That is very crisp and concise).

Figure 11:
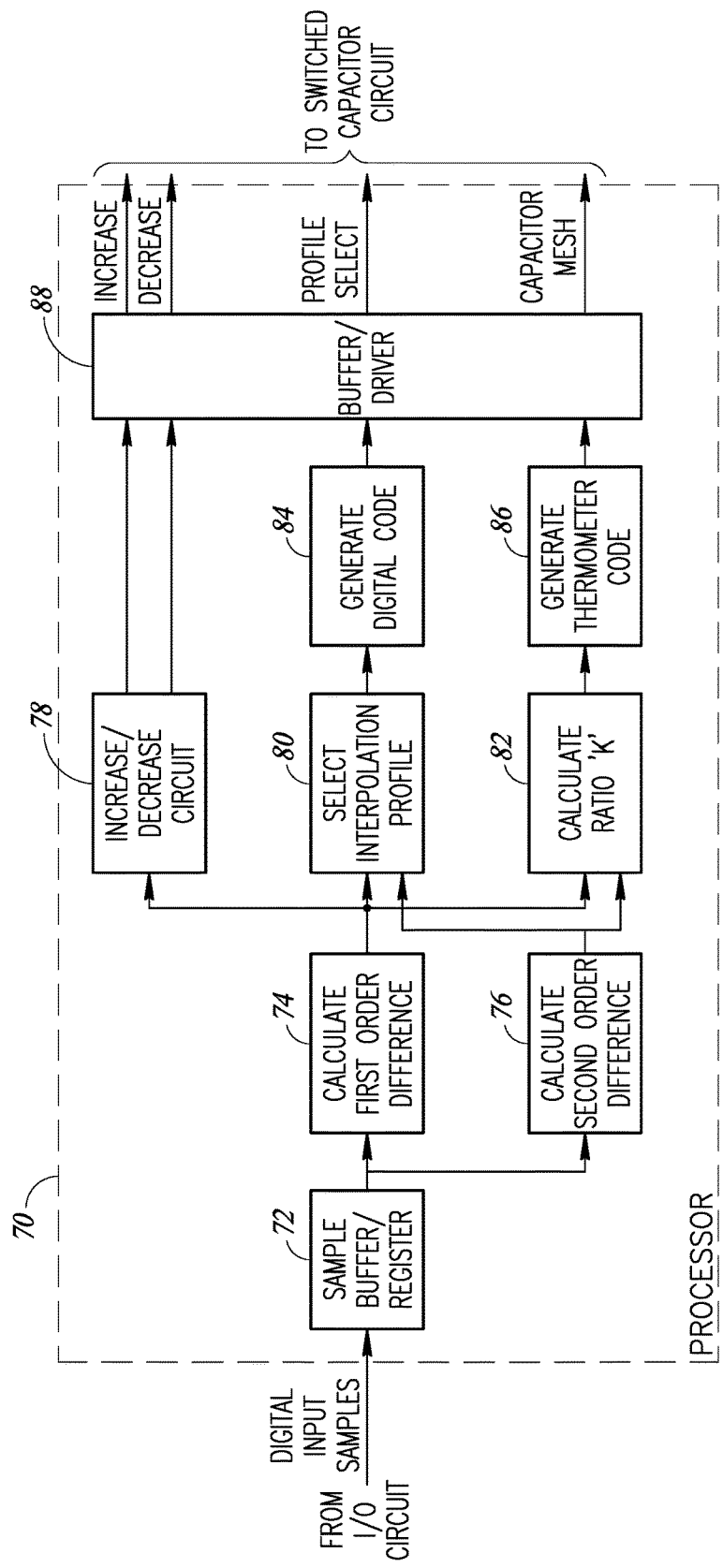
FIG. 11 is a high-level block diagram illustrating the processor of FIG. 10 in more detail.

A high-level block diagram illustrating the processor of FIG. 10 in more detail is shown in FIG. 11. The processor, generally referenced 64, comprises sample buffer/register 72, calculate first order difference block 74, calculate second order difference block 76, increase/decrease circuit 78, select interpolation profile block 80, calculate ratio 'K' block 82, generate digital code block 84, generate thermometer code block 86, and buffer/driver 88. Based on the input sample points, the processor functions to generate increase/decrease signals, a profile select signal, and a capacitor mesh select signal.

Figure 12:
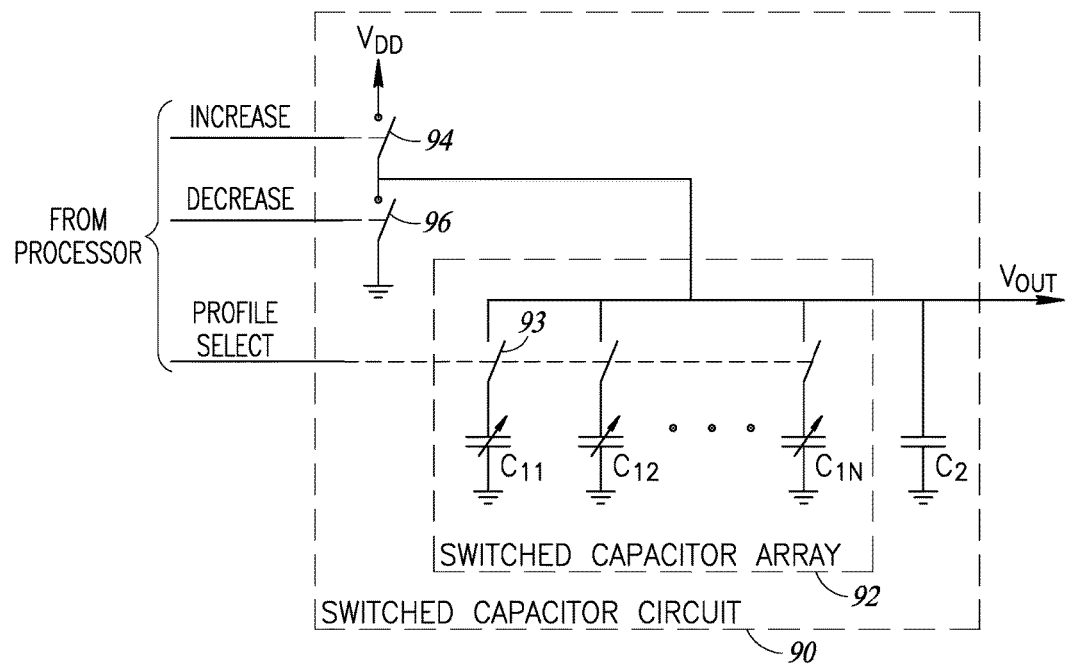
FIG. 12 is a diagram illustrating an example switched capacitor circuit of the present invention.

A diagram illustrating an example switched capacitor circuit of the present invention is shown in FIG. 12. The switched capacitor circuit, generally referenced 90, comprises a pre-charge switches 94, 96 coupled to $V_{DD}$ and ground, plurality of switched capacitor arrays 92 in parallel (e.g., $C_{11}$, $C_{12}$, ..., $C_{1N}$), and output capacitor $C_2$.

Figure 13:
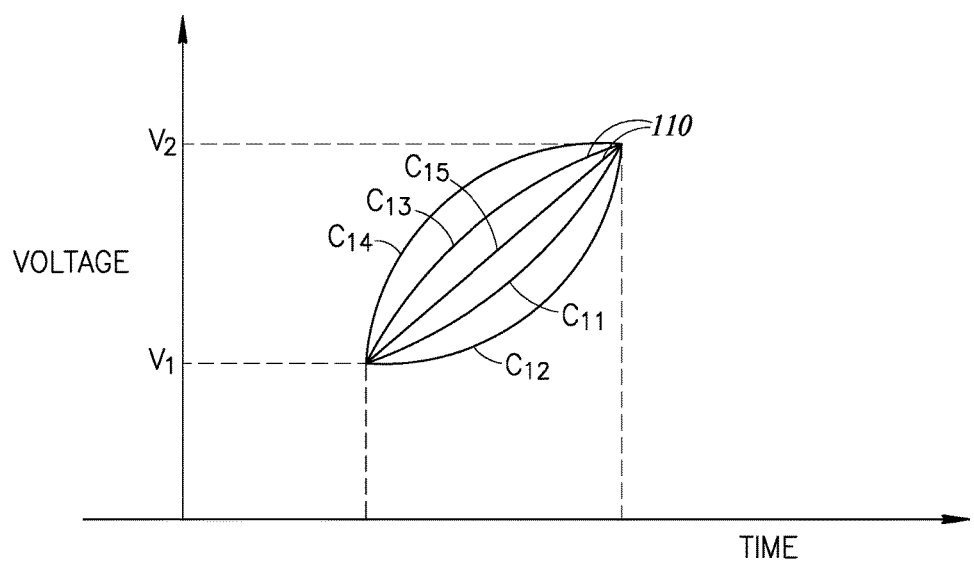
FIG. 13 is a diagram illustrating several example interpolation trajectories.

In operation, the pre-charge capacitors are controlled by the increase and decrease signals from the processor. The 'profile select' signal functions to select one of the switched capacitor arrays $C_{1N}$ coupled to the pre-charge switches via switch 93. Each switch capacitor array represents a different interpolation trajectory profile or shape. A diagram illustrating several example interpolation trajectories 110 is shown in FIG. 13. In this example, five different trajectory profiles to be used to generate the p interpolation steps between any two input sample points $V_1$ and $V_2$ are shown $C_{11}$, $C_{12}$, $C_{13}$, $C_{14}$, $C_{15}$.

Figure 14:
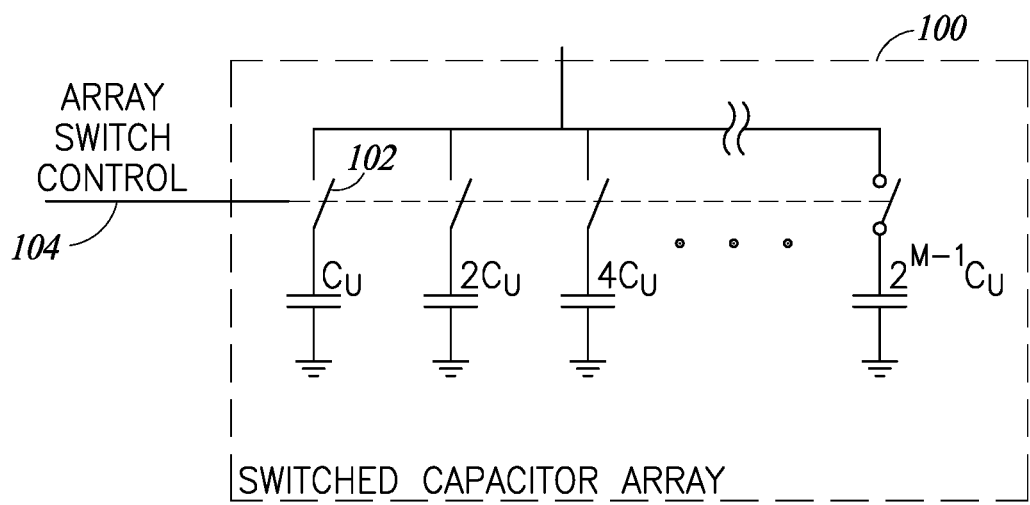
FIG. 14 is a diagram illustrating an example switched capacitor array.

A diagram illustrating an example switched capacitor array is shown in FIG. 14. The switched capacitor array, generally referenced 100, comprises a plurality of unit capacitors $C_U$, $2C_U$, ... $2^{M-1}C_U$, each coupled to a switch 102, wherein the switches are controlled by an array switch control signal 104. Note that this example represents a binary weighted trajectory. It is appreciated that other trajectories will have different values of the unit capacitor $C_U$.

Figure 15:
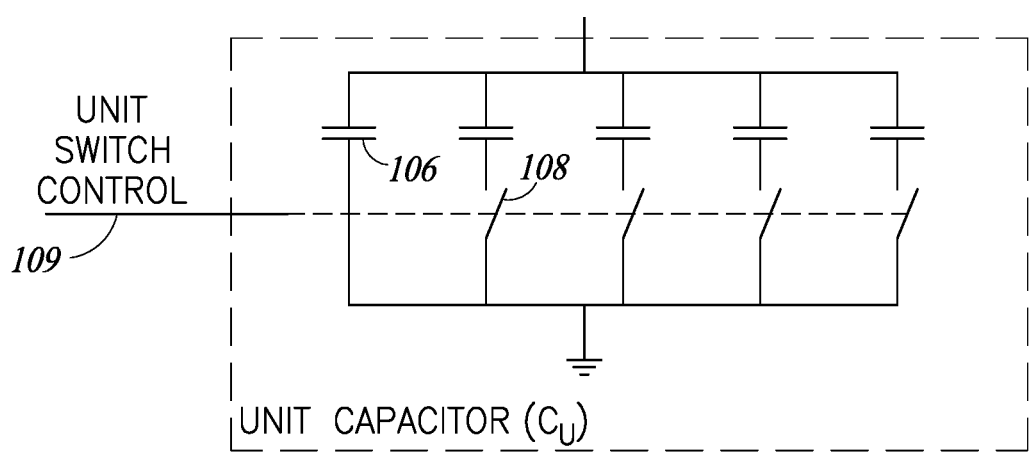
FIG. 15 is a diagram illustrating an example unit capacitor.

A diagram illustrating an example unit capacitor is shown in FIG. 15. In one embodiment, the unit capacitor, generally referenced 104, comprises a at least one capacitor 106 coupled in parallel with zero or more additional switched capacitors coupled via switches 108, wherein the switches are controlled by a unit switch control signal 109. Note that the value of the unit capacitor may be dynamically set depending on one or more conditions.

Figure 16:
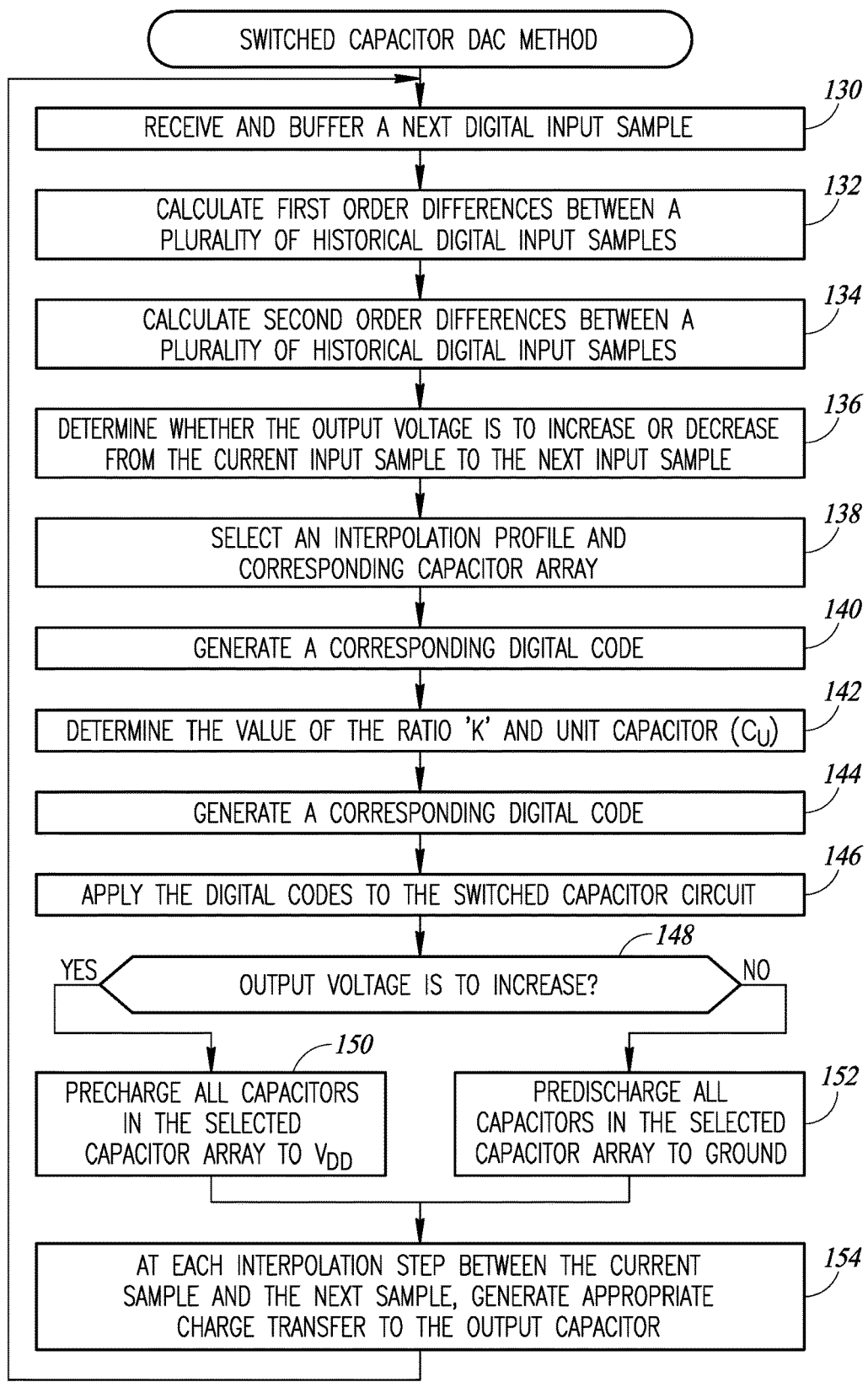
FIG. 16 is a flow diagram illustrating an example switched capacitor DAC method.

A flow diagram illustrating an example switched capacitor DAC method is shown in FIG. 16. A next digital input sample is received and buffered (step 130). First order differences between a plurality of historical digital input samples is calculated (step 132). Second order differences between a plurality of historical digital input samples is calculated (step 134). Based on the first and second order differences, it is then determined whether the output voltage is to increase or decrease from the current input sample to the next input sample (step 136).

An interpolation profile is then selected along with a corresponding switched capacitor array (step 138). The interpolation profile selected provides the best fit to the desired trajectory from the current input sample to the next input sample. A digital code (i.e. profile select) corresponding to the selected trajectories then generated (step 140). The value of the ratio 'K' and the unit capacitor ($C_U$) are also determined (step 142) and a corresponding digital code is generated (step 144). The digital codes generated are then applied to the switched capacitor circuit (step 146).

It is noted that the values of the capacitors are built into the array of the capacitors forming $C_1$ by a digital code. This means that using an extended digital code, the current values of the capacitances can be augmented (in serial or parallel) to form the desired value of the capacitance $C_1$ for the particular required profile. This effectively means that the capacitance array is formed by choosing the values of the capacitors such that the combination of the desired capacitors chosen from among the values of the capacitors mathematically calculated in an array by digital codes transforms the current profile to the desired profile to get the required trajectory.

If the output voltage is to increase (step 148), all capacitors in the selected capacitor array are pre-charged to $V_{DD}$ (step 150). On the other hand, if the output is to decrease, all capacitors in the selected capacitor array are pre-discharged to ground (step 152). At each interpolation step between the current sample and the next sample, generate an appropriate charge transfer to the output capacitor (step 154).

Figure 18:
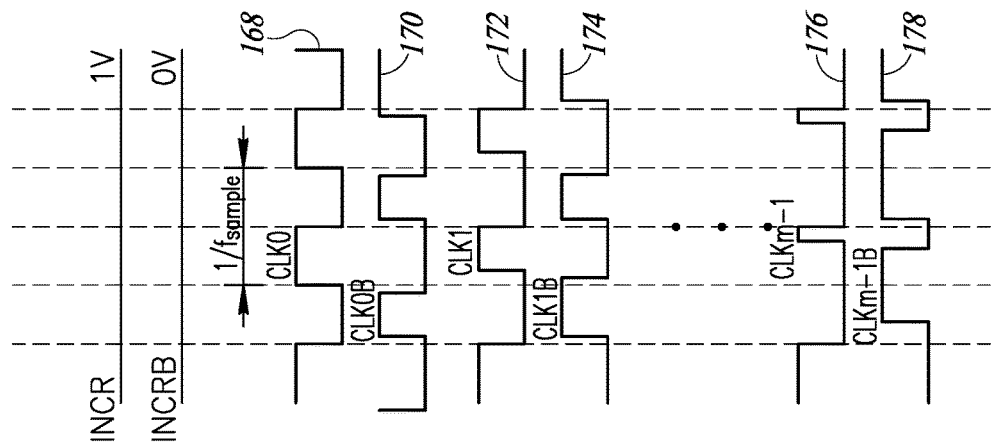
FIG. 18 is a timing diagram illustrating signal timing for the circuit of FIG. 17.
Figure 17:
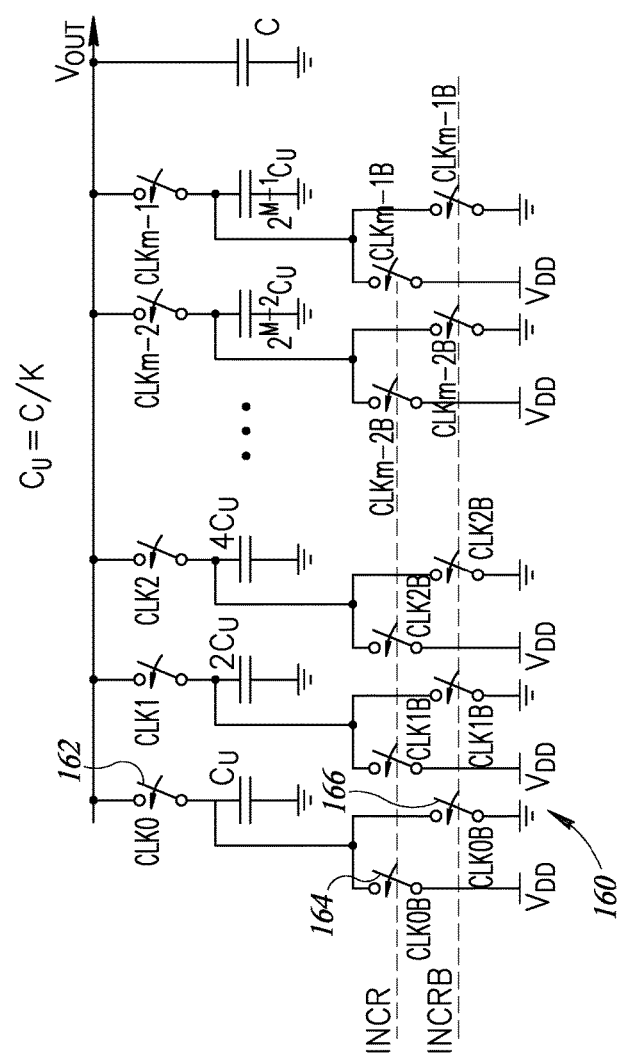
FIG. 17 is a diagram illustrating an example binary weighted concave interpolation circuit.

A diagram illustrating an example binary weighted concave interpolation circuit is shown in FIG. 17. A timing diagram illustrating signal timing for the circuit of FIG. 17 is shown in FIG. 18. The circuit, generally referenced 160, comprises a plurality of pre-charge switches 164, 166 coupled to a switched capacitor array of M binary weighted unit capacitors, i.e. $C_U$, $2C_U$, ..., $2^{M-1}C_U$ connected in parallel via switches 162. This example switched capacitor array results in a concave trajectory to generate the output voltage $V_{OUT}$. It is appreciated that other trajectories may also be used.

The circuit 260 shows values for $C_1$ (i.e. $C_U$, $2C_U$, ..., $2^{M-1}C_U$) for implementing concave interpolation between the sample points while the voltage increments. The ratio $K=C_2/C_1$ is selected between the DAC capacitors. The complimentary signals INCR and INCRB are generated from the processor and correspond to a single bit of the increment or decrement between consecutive sample voltages.

For example, consider a 4-bit interpolation having four intermediate steps. The possible code could be '1111' for increment and '0000' for the decrement. For the example scheme shown herein, the number of clock phases required is p/2 for a p-step interpolation. This is due to the fact that both ON and OFF phases per cycle can be utilized. Note that the circuit 160 is for the positive half cycle, a similar circuit also functions during the negative half cycle and the output is a result of multiplexing the output from each block during its active clock.

Note the clocks (CLK0, CLK1, ... ) 168, 172 and the derived clocks (CLK0B, CLK1B, ... ) 170, 174 used in circuit 160 function to drive independent switches. These clocks have the same frequency as the input sampling frequency of the DAC (i.e. $f_{sample}$) with different duty cycles. The clocks are designed for pre-charging the various capacitors and subsequently charge sharing for defining the output voltage without dissipating power.

A diagram illustrating the voltage 180 across the switched capacitors over time is shown in FIG. 19. A diagram illustrating the clocking 184 for the capacitors is shown in FIG. 20. A diagram illustrating the voltage 182 across the output capacitor over time is shown in FIG. 21. Note that widths of the clocks 184 are wide enough to permit sufficient charge transfer between the capacitors. Note also that all the clock signals 184 have the same falling edge timing.

The various switched capacitor arrays are activated individually by the processor for each digital input sample and the capacitors within each array are activated depending upon the number of interpolation steps. For the CMOS implementation, for example, the architecture is optimized to multiple CMOS arrays that are enabled individually and programmed to reduce the loading at each node and to facilitate dynamic programmability at all quantization levels.

Figure 23:
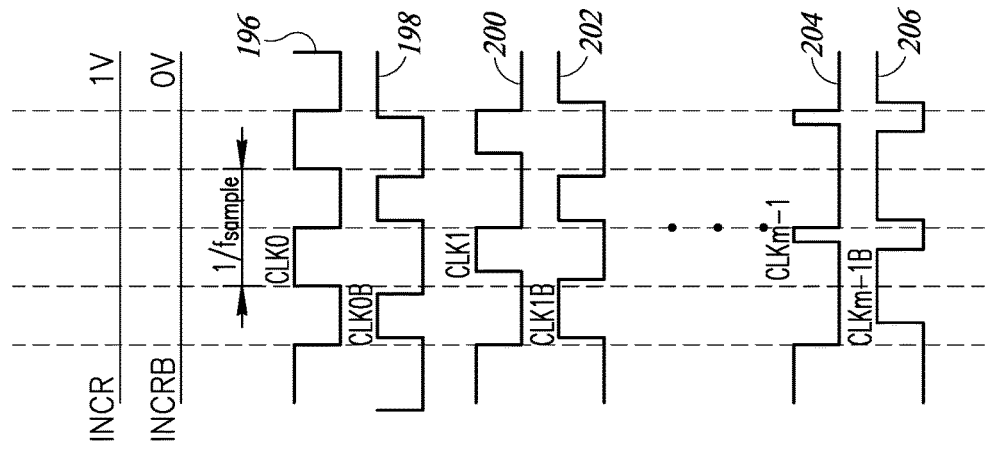
FIG. 23 is a timing diagram illustrating signal timing for the circuit of FIG. 22.
Figure 22:
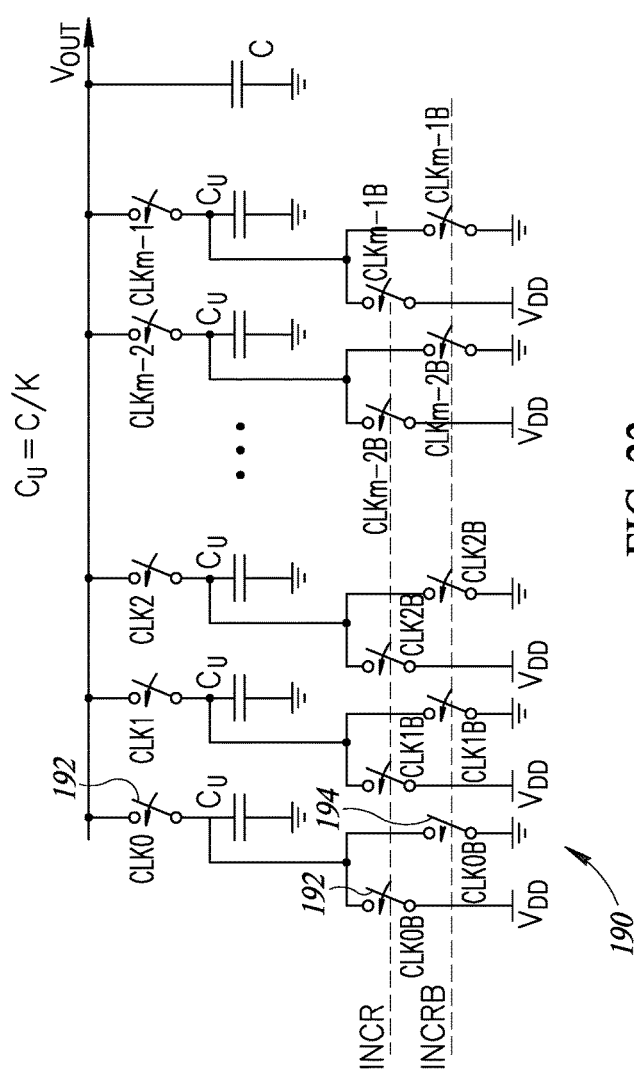
FIG. 22 is a diagram illustrating an example ascending convex interpolation circuit.
Figure 24:
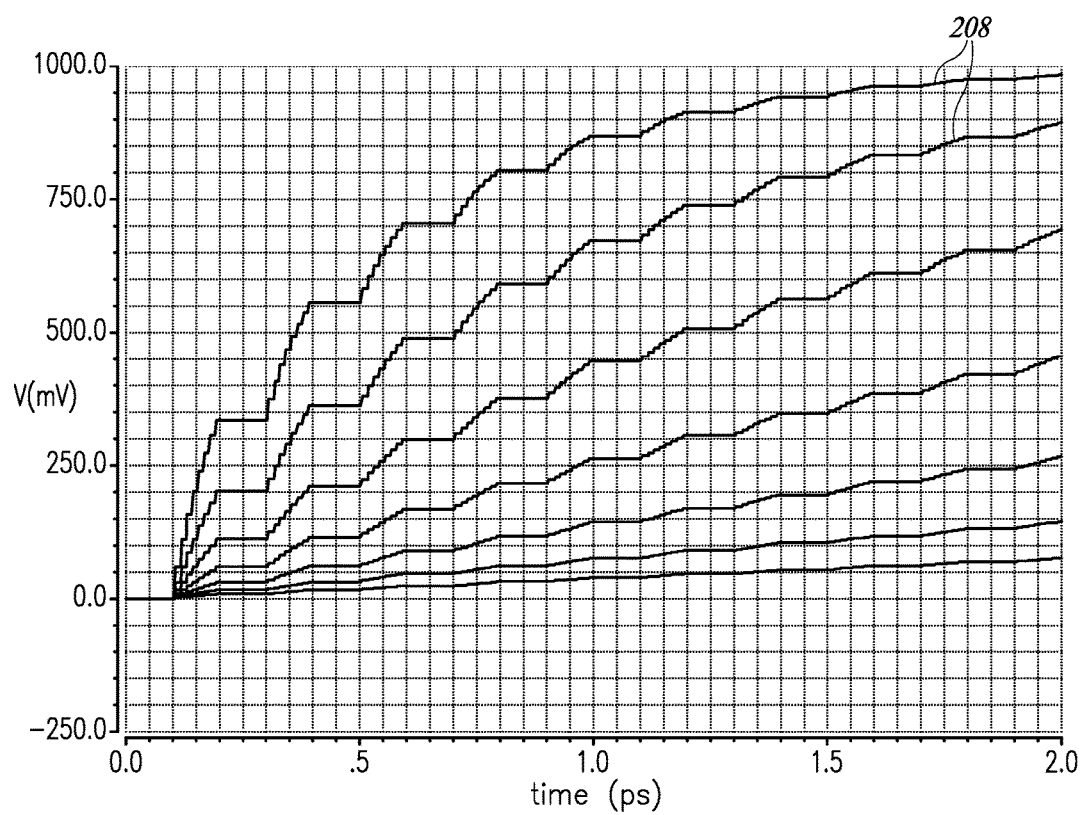
FIG. 24 is a diagram illustrating the voltage across the output capacitor over time showing the resulting desired interpolation.

A diagram illustrating an example ascending convex interpolation circuit is shown in FIG. 22. A timing diagram illustrating signal timing for the circuit of FIG. 22 is shown in FIG. 23. A diagram illustrating the voltage across the output capacitor over time showing the resulting desired interpolation is shown in FIG. 24. The circuit, generally referenced 190, comprises pre-charge switches 192, 194, capacitor array of unit capacitors $C_U$ each in series with a switch 192 to generate the output voltage $V_{OUT}$. Circuit 190 illustrates the case for convex interpolation between the sampling points with the corresponding results shown in FIG. 24 for various values of the ratio 'K'. The ratio K is defined as the ratio of the capacitance $C_2/C_1$.

Note the clocks (CLK0, CLK1, ...) 196, 200 and the derived clocks (CLK0B, CLK1B, ...) 198, 202 used in circuit 190 function to drive independent switches. These clocks have the same frequency as the input sampling frequency of the DAC (i.e. $f_{sample}$) with different duty cycles. The clocks are designed for pre-charging the various capacitors and subsequently charge sharing for defining the output voltage without dissipating power.

Similarly, the values for the capacitor arrays are calculated for the descent for higher-order interpolation (concave/convex). The calculated values of the capacitor array correspond to a mathematical series such as geometric progression, arithmetic progression, or unary increment like in thermometric codes that are relatively straightforward to implement.

Figure 25:
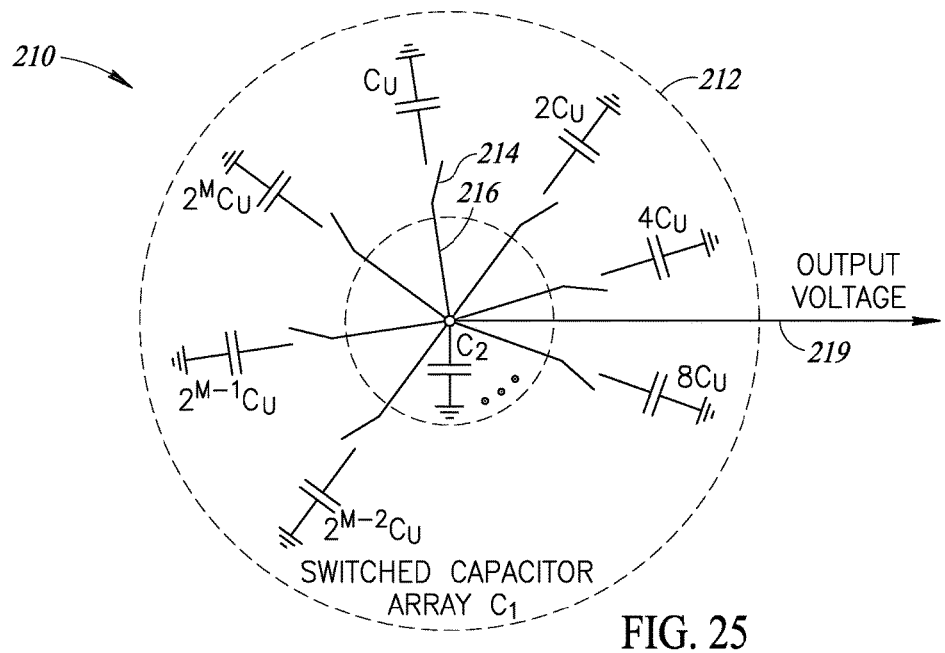
FIG. 25 is a diagram illustrating an example hub and spoke configuration for the switched capacitor DAC of the present invention.

A diagram illustrating an example hub and spoke configuration for the switched capacitor DAC of the present invention is shown in FIG. 25. In one embodiment, the switched capacitor array, generally referenced 210, comprises a switched capacitor array $C_1$ 212 consisting of a plurality of capacitors 218 and associated switches 214, and capacitor $C_2$. The capacitors $C_1$ are arranged and fabricated in silicon in the shape of a wheel with $C_2$ at the hub and array capacitors $C_1$ at the end of spokes 216. Note that wheel shape represents the symmetry of the parasitic in each path and eliminates any skew between any branches and hence maintains a uniform interpolation step contributing to the dynamic characteristics of the DAC. This necessitates every spoke of the wheel to be symmetric towards the center defining the resistance of the path (in the layout). Note also that in this example, the switched capacitor array $C_1$ is configured to yield an ascending concave interpolation at the output voltage 219.

Figure 26:
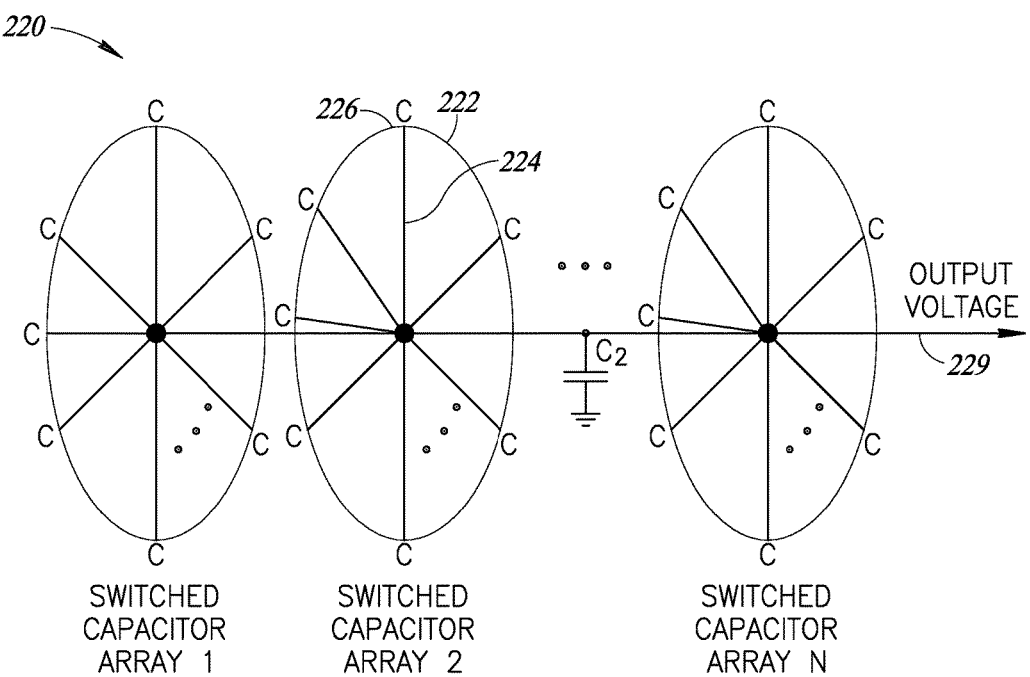
FIG. 26 is a diagram illustrating example multiple switched capacitor arrays arranged in hub and spoke configuration for the switched capacitor DAC of the present invention.

A diagram illustrating example multiple switched capacitor arrays arranged in hub and spoke configuration for the switched capacitor DAC of the present invention is shown in FIG. 26. In one embodiment, a circuit 220 comprises a plurality of N switched capacitor arrays $C_1$ 222. Each array $C_1$ 222 comprises a plurality of capacitors C 226 and associated switches (not shown), and a single common capacitor $C_2$ on which the output voltage 229 is generated. Note that the capacitors are labeled 'C' for illustration purposes only as it is understood that each can have a value in accordance with the desired interpolation trajectory that the particular switched capacitor array. As in FIG. 25, the capacitors $C_1$ are arranged and fabricated in silicon in the shape of a wheel with $C_2$ at the hub and array capacitors $C_1$ at the end of spokes 224.

Figure 27:
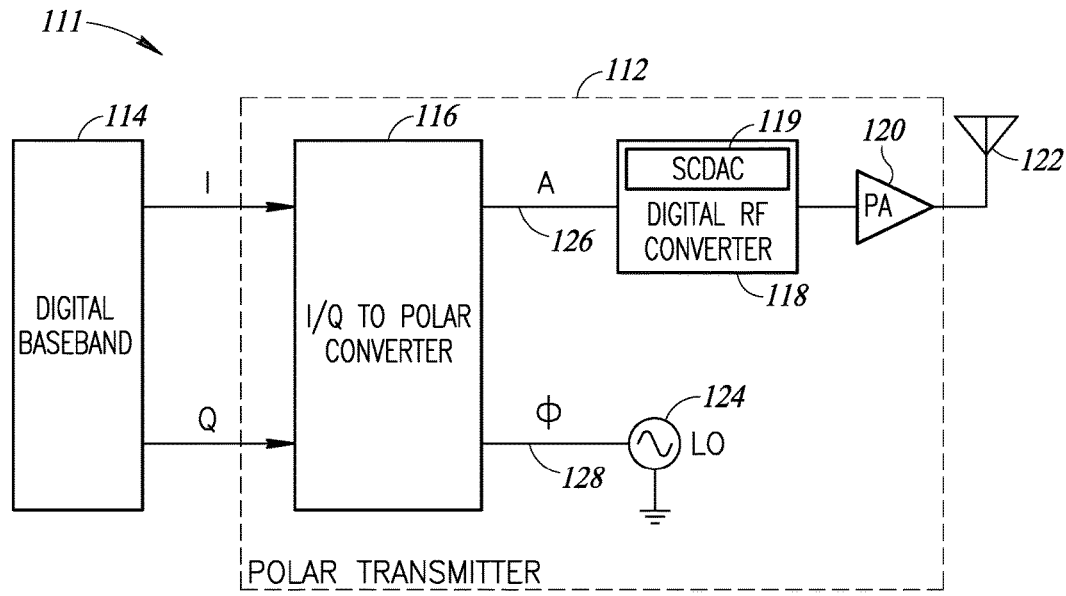
FIG. 27 is a high-level block diagram of an example polar transmitter incorporating the switched capacitor DAC of the present invention.

A high-level block diagram of an example polar transmitter incorporating the switched capacitor DAC of the present invention is shown in FIG. 27. The circuit, generally referenced 111, comprises a digital baseband 114 coupled to a polar transmitter 112. The polar transmitter 112 comprises an I/Q to polar converter 116 that is operative to receive baseband I and Q signals from digital baseband 114 and generate an amplitude A 126 and phase φ 128. The phase 128 is input to a local oscillator (LO) 124 and the amplitude 126 is input to a digital RF converter (DRFC) 118 that incorporates the switched capacitor DAC 119 of the present invention. The output of the SCDAC is input to a power amplifier (PA) 120 which functions to generate the signal sent to antenna 122.

Figure 28:
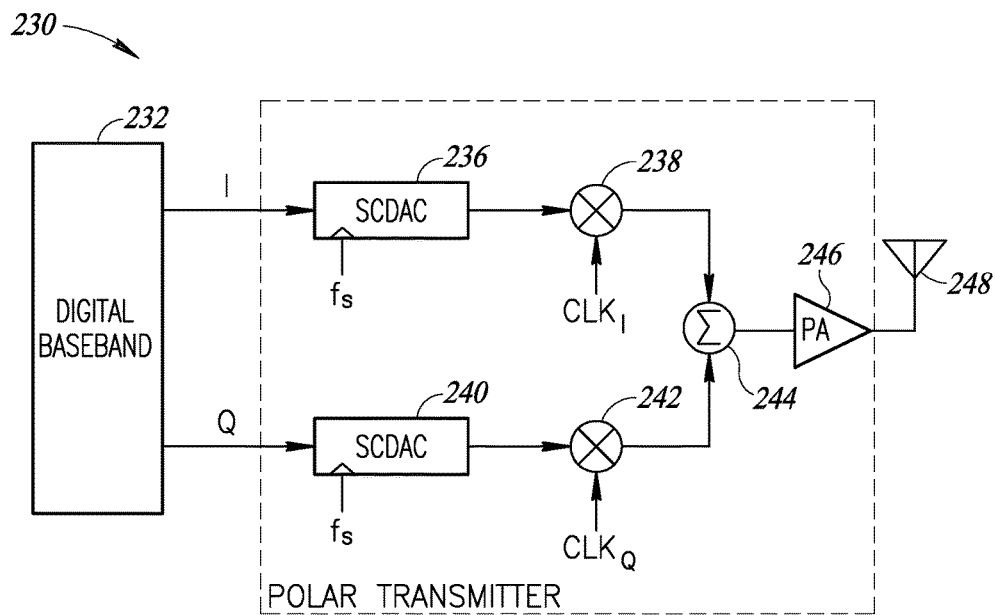
FIG. 28 is a high-level block diagram of an example quadrature transmitter incorporating the switched capacitor DAC of the present invention.

A high-level block diagram of an example quadrature transmitter incorporating the switched capacitor DAC of the present invention is shown in FIG. 28. The circuit, generally referenced 230, comprises a digital baseband 232 coupled to a quadrature transmitter 234. The quadrature transmitter 234 comprises a pair of switched capacitor DACs 236, 240 of the present invention adapted to receive the I and Q baseband signals, respectively. The output of SCDAC 236 is mixed with $CLK_I$ via mixer 238 and the output of SCDAC 240 is mixed with $CLK_Q$ via mixer 242. The outputs of both I and Q mixers are summed via adder 244 and input to power amplifier (PA) 246 before transmission over antenna 248.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A digital to analog converter (DAC) for generating a desired output voltage, comprising:
   an input circuit for receiving first digital input codes representing sample points of the desired output voltage;
   an interpolator circuit coupled to said input circuit and including one or more dynamically programmable capacitor arrays, said interpolator circuit operative to interpolate the samples points in an analog domain in accordance with a desired interpolation profile;
   an output circuit coupled to said interpolator circuit; and
   wherein said interpolator circuit is operative to generate the output voltage between said input sample points by incremental charge transfer at a rate corresponding to said interpolation profile.

2. The DAC according to claim 1, wherein interpolation occurs monotonically between consecutive sample points.

3. The DAC according to claim 1, wherein time between sample points is divided into a plurality of interpolation steps, whereby an incremental charge transfer to said output circuit occurs at each interpolation step.

4. The DAC according to claim 1, wherein said interpolation profile has a trajectory selected from a group consisting of concave, convex, linear, nonlinear, binary, exponential, arithmetic, geometric, and unary.

5. The DAC according to claim 1, wherein said interpolation circuit utilizes charge sharing within said capacitor arrays to generate the output voltage.

6. The DAC according to claim 1, wherein each capacitor array comprises a plurality of capacitor meshes incorporating unit capacitances that are controlled by a second digital code which determine the charge transferred to said output circuit.

7. The DAC according to claim 1, wherein the desired output voltage is generated in accordance with the capacitance of each capacitor mesh in said capacitor array.

8. A digital to analog converter (DAC) for generating an output voltage, comprising:
   an output capacitor adapted to provide the output voltage;
   a plurality of dynamically programmable switched capacitor arrays coupled to said output capacitor, each capacitor array switchably coupled to said output capacitor and corresponding to a different interpolation profile, each capacitor array operative to generate incremental charges that are periodically transferred to said output capacitor;
   a processor operative to:
      receive first digital input codes representing input samples of a desired output voltage;
      determine a desired voltage trajectory between consecutive input samples based on a plurality of historical input samples;
      select an interpolation profile in accordance with said desired voltage trajectory; and
      control a selected one of said capacitors arrays whereby incremental charge is transferred to the output capacitor in accordance with said selected interpolation profile.

9. The DAC according to claim 8, wherein interpolation occurs monotonically between consecutive input samples.

10. The DAC according to claim 8, wherein time between sample points is divided into a plurality of interpolation steps, whereby an incremental charge transfer to said output capacitor occurs at each interpolation step.

11. The DAC according to claim 8, wherein each said interpolation profile has a trajectory selected from a group consisting of concave, convex, linear, nonlinear, binary, exponential, arithmetic, geometric, and unary.

12. The DAC according to claim 8, wherein said interpolation circuit utilizes charge sharing within said capacitor arrays to generate the output voltage.

13. The DAC according to claim 8, wherein each capacitor array comprises a plurality of capacitor meshes incorporating unit capacitances that are controlled by a second digital code which determine the charge transferred to said output capacitor.

14. The DAC according to claim 8, wherein the desired output voltage is generated in accordance with the capacitance of each capacitor mesh in said capacitor array.

15. The DAC according to claim 8, wherein a different interpolation profile and corresponding capacitor array are selected at each input sample.

16. The DAC according to claim 8, wherein resolution of said output voltage and interpolation profile are determined by a ratio of capacitance between said selected capacitor array and said output capacitor.

17. The method according to claim 8, wherein at each interpolation step, a quantum of charge defined by values of a plurality of capacitors switching in to redistribute said quantum of charge with said output capacitor.

18. The method according to claim 17, wherein values of said plurality of capacitors are calculated in a mathematical framework that enables programming a higher order interpolation of a dynamic interpolation curve at an output of said DAC.

19. A method of converting a set of digital input codes to a desired output voltage, the method comprising:
   receiving a stream of digital input codes representing input sample points of the desired output voltage signal;
   determining a voltage excursion between consecutive input sample points;
   dividing time between consecutive input sample points into a plurality of interpolation steps; and
   at each said interpolation step, transferring charge to an output capacitor to generate the output voltage, wherein said charge is proportional to an incremental portion of said voltage excursion.

20. The method according to claim 19, wherein charge is transferred to said output capacitor utilizing one of a plurality of interpolation profiles, each representing a different desired output voltage trajectory.

21. The method according to claim 20, wherein each said interpolation profile has a trajectory selected from a group consisting of concave, convex, linear, nonlinear, binary, exponential, arithmetic, geometric, and unary.

22. The method according to claim 19, wherein interpolation occurs monotonically between consecutive input sample points.

23. The method according to claim 19, wherein transferring charge comprises utilizing charge sharing within a capacitor array to generate the output voltage.

* * * * *